(12) United States Patent
Loh et al.

(10) Patent No.: US 9,135,185 B2
(45) Date of Patent: Sep. 15, 2015

(54) DIE-STACKED MEMORY DEVICE PROVIDING DATA TRANSLATION

(71) Applicants: Gabriel H. Loh, Bellevue, WA (US); Bradford M. Beckmann, Redmond, WA (US); James M. O'Connor, Austin, TX (US); Michael Ignatowski, Austin, TX (US); Michael J. Schulte, Austin, TX (US); Lisa R. Hsu, Kirkland, WA (US); Nuwan S. Jayasena, Sunnyvale, CA (US)

(72) Inventors: Gabriel H. Loh, Bellevue, WA (US); Bradford M. Beckmann, Redmond, WA (US); James M. O'Connor, Austin, TX (US); Michael Ignatowski, Austin, TX (US); Michael J. Schulte, Austin, TX (US); Lisa R. Hsu, Kirkland, WA (US); Nuwan S. Jayasena, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 285 days.

(21) Appl. No.: 13/726,143

(22) Filed: Dec. 23, 2012

(65) Prior Publication Data

US 2014/0181458 A1 Jun. 26, 2014

(51) Int. Cl.
*G06F 12/02* (2006.01)
*G06F 12/10* (2006.01)

(52) U.S. Cl.
CPC ......... *G06F 12/1027* (2013.01); *Y02B 60/1225* (2013.01)

(58) Field of Classification Search
CPC .................... G06F 12/0246; G06F 12/1027
See application file for complete search history.

(56) References Cited

U.S. PATENT DOCUMENTS

| | | |
|---|---|---|
| 6,189,065 B1 | 2/2001 | Arndt et al. |
| 6,519,674 B1 | 2/2003 | Lam et al. |
| 7,477,535 B2 | 1/2009 | Lahtinen et al. |
| 7,796,446 B2 | 9/2010 | Ruckerbauer et al. |
| 7,930,661 B1 * | 4/2011 | Trimberger et al. ........... 716/104 |
| 8,233,303 B2 | 7/2012 | Best et al. |
| 8,356,138 B1 * | 1/2013 | Kulkarni et al. .............. 711/105 |
| 8,423,789 B1 * | 4/2013 | Poo et al. ...................... 713/189 |
| 8,451,014 B2 | 5/2013 | Black et al. |
| 8,519,739 B1 | 8/2013 | Leon |
| 8,546,955 B1 | 10/2013 | Wu |
| 8,700,951 B1 | 4/2014 | Call et al. |
| 8,778,734 B2 | 7/2014 | Metsis |
| 2004/0153902 A1 | 8/2004 | Machado et al. |
| 2006/0164882 A1 | 7/2006 | Norman |
| 2008/0066302 A1 | 3/2008 | Chung |
| 2008/0320346 A1 | 12/2008 | Lin |
| 2009/0017580 A1 | 1/2009 | Smith |
| 2009/0055596 A1 | 2/2009 | Wallach et al. |

(Continued)

OTHER PUBLICATIONS

International Search Report and Written Opinion correlating to PCT/US2013/053599 (110245-PCT) dated Dec. 9, 2013, 8 pages.

(Continued)

*Primary Examiner* — Hiep Nguyen

(57) ABSTRACT

A die-stacked memory device incorporates a data translation controller at one or more logic dies of the device to provide data translation services for data to be stored at, or retrieved from, the die-stacked memory device. The data translation operations implemented by the data translation controller can include compression/decompression operations, encryption/decryption operations, format translations, wear-leveling translations, data ordering operations, and the like. Due to the tight integration of the logic dies and the memory dies, the data translation controller can perform data translation operations with higher bandwidth and lower latency and power consumption compared to operations performed by devices external to the die-stacked memory device.

23 Claims, 9 Drawing Sheets

(56) References Cited

U.S. PATENT DOCUMENTS

| | | | |
|---|---|---|---|
| 2009/0103345 A1* | 4/2009 | McLaren et al. | 365/64 |
| 2009/0190404 A1 | 7/2009 | Roohparvar | |
| 2009/0313483 A1 | 12/2009 | Ranade | |
| 2010/0005118 A1 | 1/2010 | Sezer | |
| 2010/0008058 A1 | 1/2010 | Saen et al. | |
| 2010/0070696 A1 | 3/2010 | Blankenship | |
| 2010/0070782 A1 | 3/2010 | Majewski et al. | |
| 2010/0157644 A1* | 6/2010 | Norman | 365/51 |
| 2010/0161918 A1 | 6/2010 | Norman | |
| 2010/0167100 A1 | 7/2010 | Moore et al. | |
| 2011/0231739 A1 | 9/2011 | Kim | |
| 2012/0023376 A1 | 1/2012 | Jeddeloh | |
| 2012/0079176 A1* | 3/2012 | Sun et al. | 711/103 |
| 2012/0104578 A1 | 5/2012 | Hu et al. | |
| 2012/0130983 A1 | 5/2012 | Ryan et al. | |
| 2012/0204073 A1 | 8/2012 | Whetsel | |
| 2012/0273782 A1 | 11/2012 | Goel et al. | |
| 2012/0290793 A1* | 11/2012 | Chung et al. | 711/119 |
| 2013/0031330 A1 | 1/2013 | Jones et al. | |
| 2013/0042060 A1 | 2/2013 | Marukame et al. | |
| 2013/0086353 A1 | 4/2013 | Colgrove et al. | |
| 2013/0257481 A1 | 10/2013 | Metsis | |
| 2013/0292840 A1* | 11/2013 | Shoemaker et al. | 257/773 |
| 2014/0013169 A1* | 1/2014 | Kobla et al. | 714/718 |
| 2014/0085959 A1* | 3/2014 | Saraswat et al. | 365/63 |
| 2014/0108891 A1 | 4/2014 | Strasser et al. | |
| 2014/0173113 A1 | 6/2014 | Vemuri et al. | |

OTHER PUBLICATIONS

International Search Report and Written Opinion correlating to PCT/US2013/053596 (110209-PCT) dated Dec. 9, 2013, 8 pages.
International Search Report and Written Opinion correlating to PCT/US13/075956 dated May 9, 2014, 13 pages.
Non-Final Office Action mailed May 14, 2014 for U.S. Appl. No. 13/726,145, 23 pages.
Non-Final Office Action mailed Jun. 20, 2014 for U.S. Appl. No. 13/567,945, 31 pages.
Final Office Action mailed Aug. 11, 2014 for U.S. Appl. No. 13/567,958, 27 pages.
Notice of Allowance mailed Aug. 25, 2014 for U.S. Appl. No. 13/726,145, 22 pages.
Non-Final Office Action mailed Nov. 7, 2014 for U.S. Appl. No. 13/726,142, 20 pages.
Final Office Action mailed Oct. 31, 2014 for U.S. Appl. No. 13/567,945, 23 pages.
Nathan Brookwood, "AMD Fusion Family of APUs: Enabling a Superior, Immersive PC Experience", AMD White Paper: AMD Fusion Family of APUs, Mar. 2010, 8 pages.
"How Computers Work: The CPU and Memory", <http://homepage.cs.url.edu/faculty/wolfe/book/Readings/Reading04.htm> Feb. 1, 2002, 1 page.
N.S. Matlo, "Introduction to Microcoded Implementation of a CPU Architecture", <http://www.cs.ucsb.edu/~chong/154/Tan.pdf> Jan. 21, 1997, 12 pages.
Lixin Tao, "Interrupt Processing", <http://csis.pace.edu/~lixin/teaching/cs371/interrupt.pdf> Sep. 2002, 3 pages.
Shawn Hargreaves, "An elf in a box", <http://blogs.msdn.com/b/shawnhar/archive/2008/03/31/an-elf-in-a-box.aspx> Mar. 31, 2008, 5 pages.
Chris Rawson, "Mac 101: Integrated versus discrete graphics", <http://www.tuaw.com/2010/05/14/mac-101-integrated-versus-discrete-graphics/> May 14, 2010, 2 pages.
Matthew Hogan, "Silicon Interposers: building blocks for 3D-Ics", <http://electroiq.com/blog/2011/06/silicon-interposers-building-blocks-for-3d-ics/> Jun. 14, 2011, 6 pages.

Nigel Jacob, "Offloading IDS Computation to the GPU", 22nd Annual Computer Security Applications Conference (ACSAC'06), <http://www.acsac.org/2006/papers/74.pdf> Dec. 21, 2006, 10 pages.
Laura Tiffany, "How Many Computer Processors Do You Need?" <http://www.allbusiness.com/computing-information-technology/parallel-computing/12603535-1/html> Aug. 7, 2009, 2 pages.
QNX "Processes and Threads", <http://www.qnx.com/developers/docs/6.4.0/neutrino/getting_started/s1_procs.html> May 29, 2009, 20 pages.
Eric Chan, "GPU Gems 2" <http://http.developer.nvidia.com/GPUGems2_chapter22.html> Apr. 15, 2005, Chapter 22, 11 pages.
Yi Yang et al. "CPU-assisted GPGPU on fused CPU-GPU architectures", IEEE, Feb. 2012, 12 pages.
Debra Cook et al. "Secret Key Cryptography Using Graphics Cards", Columbia University Technical Report, Jan. 14, 2004, 14 pages.
Matthew Hogan et al. "Robust Verification of 3D-Ics: Pros, Cons and Recommendations", IEEE, Aug. 21, 2009, 6 pages.
Carlos Carvalho, "The Gap Between Processor and Memory Speeds", ICCA, 2002, 8 pages.
Christianto C. Liu et al. "Bridging the Processor-Memory Performance Gap with 3D IC Technology", IEEE vol. 22, Issue 6, Nov. 21, 2005, 9 pages.
Jon Stokes "Ask Ars: what is a CPU thread?" Ministry of Innovation of Technology, Apr. 12, 2011, 2 pages.
"Computer-System Operation", <http://siber.cankaya.edu.tr/operatingsystems/ceng328/node15.html> Feb. 14, 2011, 4 pages.
Non-Final Office Action mailed Dec. 20, 2013 for U.S. Appl. No. 13/567,945, 13 pages.
Non-Final Office Action mailed Feb. 27, 2014 for U.S. Appl. No. 13/567,958, 24 pages.
U.S. Appl. No. 13/328,393, filed Dec. 16, 2011, entitled "Memory Architecture for Read-Modify-Write Operations".
U.S. Appl. No. 13/567,945, filed Aug. 6, 2012, entitled "Stacked Memory Device With Metadata Mangement".
U.S. Appl. No. 13/567,958, filed Aug. 6, 2012, entitled "Stacked Memory Device With Helper Processor".
U.S. Appl. No. 13/726,142, filed Dec. 23, 2012, entitled "Die-Stacked Device With Partitioned Multi-Hop Network".
U.S. Appl. No. 13/726,144, filed Dec. 23, 2012, entitled "Quality of Service Support Using Stacked Memory Device With Logic Die".
U.S. Appl. No. 13/726,145, filed Dec. 23, 2012, entitled "Die-Stacked Memory Device With Reconfigurable Logic".
U.S. Appl. No. 13/726,146, filed Dec. 23, 2012, entitled "Cache Coherency Using Die-Stacked Memory Device With Logic Die".
David Patterson et al., "FP 14.1: Intelligent RAM (IRAM: Chips That Remember & Compute", 1997 IEEE International Solid-State Circuits Conference, Feb. 7, 1997, 2 pages.
Gabriel H. Loh, "3D-Stacked Memory Architectures for Multi-Core Processors", ISCA '08 Proceedings of the 35th Annual International Symposium on Computer Architecture, Jun. 2008, pp. 453-464.
J. Thomas Pawlowski, "Hybrid Memory Cube (HMC)", Micron Technologies, Aug. 4, 2011, 24 pages.
Intel Platform Brief "Intel Atom Processor E6x5C Series-Based Platform for Embedded Computing", http://newsroom.intel.com/servlet/jiveservlet/download/1512-31-3257/ProductBrief-IntelAtomProcessor_E600C_series_v2.pdf, Jan. 2010, 4 pages.
Stretch, Inc. Configurable Processors, http://www.stretchinc.com, Accessed Apr. 2, 2013, 1 page.
NPL Non-Final Office Action mailed Jan. 15, 2015 for U.S. Appl. No. 13/941,791, 33 pages.
U.S. Appl. No. 14/551,147, filed Nov. 24, 2014, entitled "Die-Stacked Memory Device Wtih Reconfigurable Logic".
Non-Final Office Action mailed Dec. 22, 2014 for U.S. Appl. No. 13/726,144, 14 pages.
Non-Final Office Action mailed Dec. 23, 2014 for U.S. Appl. No. 13/726,146, 14 pages.

* cited by examiner

DIE-STACKED MEMORY DEVICE PROVIDING DATA TRANSLATION

BACKGROUND

1. Field of the Disclosure

The present disclosure relates generally to memory devices and more particularly to die-stacked memory devices.

2. Description of the Related Art

Processing systems generally implement system memory as a device separate from the devices implementing processors, input/output (I/O) components, and other components. Such systems therefore are often bandwidth-limited due to the volume of traffic on the interconnect connecting the system memory to the other components and latency-limited due to the propagation delay of the signaling traversing the relatively-long interconnect and due to the handshaking process needed to conduct such signaling. The inter-device bandwidth and inter-device latency have a particular impact on processing efficiency and power consumption for data translation operations. To perform a data translation operation, a system component typically accesses data from the system memory, transforms the data, and then stores the translated data back to the system memory. As such, each data translation often involves at least two memory accesses, and thus the inter-device bandwidth and latency penalties are incurred twice for each data translation. Moreover, these bandwidth and latency issues are compounded by the fact that many data translation operations involve numerous data translations.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

Figure 1:
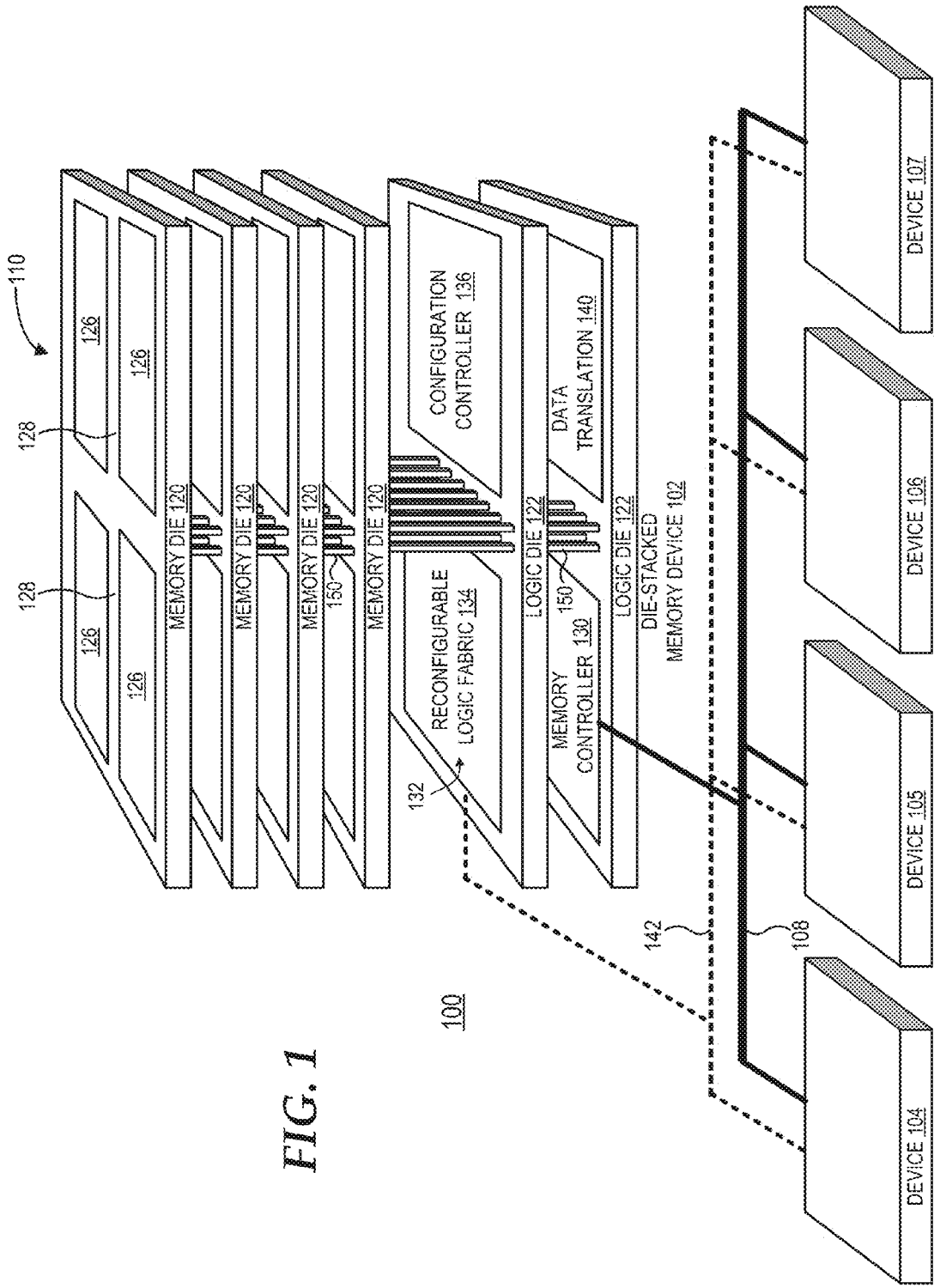
FIG. 1 is a diagram illustrating an exploded perspective view of a vertical-stack configuration of a processing system implementing a die-stacked memory device in accordance with some embodiments.

The following description illustrates example techniques for improved processing efficiency and decreased power consumption in a processing system through the use of a die-stacked memory device incorporating a reconfigurable logic device to provide implementation flexibility in performing various data manipulation operations and other memory operations that use data stored in the die-stacked memory device or that result in data that is to be stored in the die-stacked memory device. The reconfigurable logic device can include, for example, a field-programmable gate array (FPGA), a programmable array logic (PAL) device, a programmable logic array (PLA) device, or a programmable logic device (PLD).

In some embodiments, one or more configuration files representing corresponding logic configurations for the reconfigurable logic device can be stored in a configuration store at the die-stacked memory device, and a configuration controller can program a reconfigurable logic fabric of the reconfigurable logic device using a selected one of the configuration files. The particular configuration file used to program the reconfigurable logic fabric can be selected based on a software-accessible configuration element, such as a programmable register or programmable location in the one or more stacked memory dies of the die-stacked memory device, thereby allowing dynamic in-system configuration of the logic operations performed by the reconfigurable logic device.

Due to its tight integration with the one or more memory dies, the reconfigurable logic device can rapidly access the stacked memory dies for store or load purposes, and thus perform related data manipulation operations with higher bandwidth and lower latency and power consumption compared to the performance of the same data manipulation operations by devices external to the die-stacked memory device. Moreover, the offloading of these data manipulation operations to the die-stacked memory device frees up bandwidth on the system memory bus and permits the external devices to perform other tasks focusing on program execution, thereby increasing the overall processing throughput of the system. Moreover, this approach provides the flexibility to update the implementing system in view of new or changing industry standards or other changing requirements without the need to redesign components of the system. Likewise, certain classes of bugs or other defects may be efficiently addressed using the techniques described herein so as to reduce or eliminate the need for a redesign or revalidation of hardware.

The following description also illustrates example techniques for improved processing efficiency and decreased power consumption in a processing system through the use of a die-stacked memory device incorporating a data translation controller that can perform one or more various data translation operations for data that is to be stored in the die-stacked memory device, that is accessed from the die-stacked memory device, or that is provided to the die-stacked memory device. The data translation controller is formed at one or more logic dies of the die-stacked memory device, and may be implemented as reconfigurable logic, such as the reconfigurable logic device described herein, as hard-coded logic, or as a combination of reconfigurable logic and hardcoded logic. The data translation operations performed by the data translation controller can include encryption/decryption operations, data compression/decompression operations, data format translations (e.g., big endian to little endian byte ordering), data ordering operations (e.g., data element sorting), bit-shifting for wear-leveling purposes, and the like. In some embodiments, the data translation operations are performed by the die-stacked memory device in response to commands from devices external to the die-stacked memory device. The data translation operations also may be performed independent of, or transparently to, the external devices. By offloading data translation operations to the die-stacked memory device, the die-stacked memory device can take advantage of its tight internal coupling between the logic die and the memory die so as to perform data translation operations without utilizing the memory interconnect connecting the die-stacked memory device to external devices, thereby freeing bandwidth of the memory interconnect for other transactions while reducing the power consumption that otherwise would be necessary to communicate the data over the memory interconnect in order for an external device to perform the data translation operation.

FIG. 1 illustrates a processing system 100 in accordance with some embodiments. The processing system 100 may comprise any of a variety of computing systems, including a notebook or tablet computer, a desktop computer, a server, a network router, switch, or hub, a computing-enabled cellular phone, a personal digital assistant, and the like. In the depicted example, the processing system 100 includes a die-stacked memory device 102 implemented as system memory or other memory shared by a plurality of devices, such as devices 104, 105, 106, and 107. In the illustrated example, the devices 104-107 are coupled to the die-stacked memory device 102 via a single inter-device interconnect 108. However, in other embodiments, each device may be coupled to the die-stacked memory device 102 via a separate interconnect or subsets of the devices may be coupled to the die-stacked memory device 102 via corresponding separate interconnects. The processing system 100 also can include a variety of other components not illustrated in FIG. 1, such as one or more display components, storage devices, input devices (e.g., a mouse or keyboard), and the like.

In some embodiments, the devices 104-107 are implemented individually or in combination as one or more integrated circuit (IC) packages and the die-stacked memory device 102 is implemented as an IC package 110 separate from the IC packages implementing the devices 104-107. In other embodiments, some or all of the devices 104-107 and the die-stacked memory device 102 are implemented as separate sets of dies connected via an interposer in the same IC package 110. In either instance, the term "external device," as used herein, refers to a device not implemented in (that is, "external to") the dies that compose the die-stacked memory device 102. As such, the devices 104-107 are referred to herein as "external devices 104-107."

The external devices of the processing system 100 can include any of a variety of types of devices that can share memory, including, but not limited to, processors or processor cores (which may include central processing units, graphics processing units, digital signal processors, and the like), input/output (I/O) controllers, network interface controllers (NICs), disk direct memory access (DMA) engines, and the like. The one or more inter-device interconnects 108 connecting the external devices 104-107 and the die-stacked memory device 102 can be implemented in accordance with any of a variety of conventional interconnect or bus architectures, such as a Peripheral Component Interconnect—Express (PCI-E) architecture, a HyperTransport architecture, a QuickPath Interconnect (QPI) architecture, and the like. Alternatively, the interconnect 108 can be implemented in accordance with a proprietary bus architecture. The interconnect 108 includes a plurality of conductors coupling transmit/receive circuitry of corresponding external devices with transmit/receive circuitry of the die-stacked memory device 102. The conductors can include electrical conductors, such as printed circuit board (PCB) traces or cable wires, optical conductors, such as optical fiber, or a combination thereof.

The die-stacked memory device 102 implements any of a variety of memory cell architectures, including, but not limited to, volatile memory architectures such as dynamic random access memory (DRAM) and static random access memory (SRAM), or non-volatile memory architectures, such as read-only memory (ROM), flash memory, ferroelectric RAM (F-RAM), magnetoresistive RAM, and the like. Moreover, the die-stacked memory device 102 can incorporate combinations of memory technologies, such a combination of memory die implementing DRAM and memory die implementing SRAM. For ease of illustration, the example implementations of the die-stacked memory device 102 are described herein in the example, non-limiting context of a DRAM architecture.

As illustrated by the exploded perspective view of FIG. 1, the die-stacked memory device 102 comprises a set of stacked memory dies 120 and a set of one or more logic dies 122. Each memory die 120 comprises memory cell circuitry 126 implementing bitcells in accordance with the memory architecture of the die-stacked memory device 102 and the peripheral logic circuitry 128 implements the logic and other circuitry to support access and maintenance of the bitcells in accordance with this memory architecture. To illustrate, DRAM typically is composed of a number of ranks, each rank comprising a plurality of banks, and each bank comprising a matrix of bitcells set out in rows and columns. Accordingly, in some embodiments, each memory die 120 may implement one rank (and thus the banks of bitcells for the corresponding rank). In other embodiments, the DRAM ranks each may be implemented across multiple memory dies 120. For example, the die-stacked memory device 102 may implement four ranks, each rank implemented at a corresponding quadrant of each of the memory dies 120. In either implementation, to support the access and maintenance of the DRAM bit cells, the peripheral logic circuitry 128 may include, for example, line drivers, bitline/wordline precharging circuitry, refresh circuitry, row decoders, column select logic, row buffers, sense amplifiers, and the like.

The one or more logic dies 122 implement hardware logic to facilitate access to the memory of the die-stacked memory device 102. This logic includes, for example, a memory controller 130, built-in self-test (BIST) logic (not shown), and the like. The memory controller 130 supports the utilization of the memory cell circuitry 126 as system memory or other memory shared within the processing system 100, and thus includes circuitry to facilitate the reception, buffering, and servicing of memory access requests. This circuitry can include, for example, receivers and line drivers, memory request buffers, scheduling logic, row/column decode logic, refresh logic, data-in and data-out buffers, clock generators, and the like. The memory controller 130 further comprises an interface for each inter-device interconnect 108 implemented in the processing system 100, each interface comprising a physical layer interface (PHY) coupleable to the conductors of the corresponding interconnect, and thus coupleable to the external devices associated with that interconnect. To illustrate, FIG. 1 depicts an example whereby the external devices 104-107 are connected to the memory controller 130 via a single interconnect 108, and thus the memory controller 130 would include a single interface. In an alternative example implementation, the external devices 104 and 105 could be coupled to the memory controller 130 via one interconnect and the external devices 106 and 107 could be coupled to the memory controller 130 via a separate interconnect. In this example, the memory controller 130 thus would include two interfaces, one for each interconnect.

In addition to implementing logic to facilitate access to the memory implemented by the memory die 120, in some embodiments one or more logic die 122 implement a reconfigurable logic device 132 to perform data manipulation operations and other memory-related operations in accordance with a programmed logic configuration. The reconfigurable logic device 132 comprises a reconfigurable logic fabric 134 that can be programmed to implement any of a variety of operational configurations. Thus, the reconfigurable logic fabric can include compute elements, storage (memory) elements, and communication elements. The reconfigurable logic fabric 134 can implement one or more reconfigurable logic architectures, including fine-grained reconfigurable logic architectures such as field-programmable gate array (FPGA) architectures. The reconfigurable logic fabric 134 also can implement, for example, coarser-grained reconfigurable logic architectures, such as a composable logic architecture a collection of resources, such as arithmetic logical units (ALUs), register/memory structures, IO elements, and reconfigurable routing structures are fabricated in advanced and then grouped and connected in different ways post-fabrication through the configuration techniques described herein to implement various functions. The reconfigurable logic fabric 134 can be architected so as to be reconfigurable once or a small number of times, such as by implementing an electrically programmable read-only memory (EPROM)-based complex programmable logic device (CPLD) architecture, or architected so as to be reconfigurable many times, such as by implementing a SRAM-based or flash-based FPGA architecture.

In some embodiments, the reconfigurable logic fabric 134 implements a reconfigurable logic architecture that requires resources typically unavailable in the field and thus is reconfigured for a particular programmed logic configuration at assembly time, such as during chip packaging or system assembly. For example, some EPROM-based reconfigurable logic architectures require exposure to ultraviolet light, which may be impracticable to supply in the field. In other embodiments, the reconfigurable logic fabric 134 implements a reconfigurable logic architecture that can be reconfigured in the field. To this end, the reconfigurable logic device 132 can implement a configuration controller 136 at one or more logic die 122 so as to provide in-system programmability for the reconfigurable logic fabric 134. The configuration controller 136 has access to a configuration store that stores one or more configuration files that may be used to program the reconfigurable logic fabric 134. In instances where there is more than one configuration file available, the particular configuration file selected to program the reconfigurable logic fabric 134 can be controlled via, for example, a programmable register or other software-programmable control element of the die-stacked memory device 102. Alternatively, the configuration controller 136 could be implemented outside of the die-stacked memory device 102, such as in one of the external devices 104-107, or via a field-portable device programmer which temporarily connects to the die-stacked memory device 102 via, for example, a Joint Text Action Group (JTAG) port to program the reconfigurable logic fabric 134.

Moreover, in some embodiments one or more logic die 122 implement a data translation controller 140 to perform data translation operations for data received at, stored in, or accessed from, the set of one or more stacked memory die 120. The data translation controller 140 is coupled to the memory controller 130 and comprises logic and other circuitry to support one or more data translation operations, which may include encryption or decryption operations, compression or decompression operations, data format translations, data element ordering, data swizzling or other bit-shifting for wear leveling, and the like. The data translation controller 140 may use hard-coded logic, reconfigurable logic such as the reconfigurable logic device 132 described herein, or a combination of hard-coded logic and reconfigurable logic. The data translation controller 140 is described in greater detail below with reference to FIGS. 5-10.

In some embodiments, the memory controller 130 acts as the interface between the eternal devices 104-107 and the on-die logic (e.g., the reconfigurable logic device 132 or the data translation controller 140). In this implementation, memory access requests, commands, confirmations, and other signaling is routed between the external devices 104-107 and the on-die logic via the memory controller 130, and the memory controller 130 operates to access the memory dies 120. In other embodiments, the external devices 104-107 can communicate directly with the on-die logic without the memory controller 130 as an intermediary. To illustrate, the processing system 100 could implement a side-band interconnect 142 to connect the external devices 104-107 directly to the reconfigurable logic device 132 so that the reconfigurable logic device 132 can respond directly to commands from the external devices 104-107. Likewise, a similar side-band interconnect can be implemented to directly connect the data translation controller 140 to the external devices 104-107. Moreover, in some embodiments, the memory controller 130 acts as the interface between the on-die logic and the memory dies 120. In this implementation, the on-die logic interfaces with the memory controller 130 to access data from the memory circuitry 126 and to store data to the memory circuitry 126. In other embodiments, the on-die logic can implement a memory interface separate from the memory controller 130. To illustrate, the reconfigurable logic device 132 can implement a specially-tailored memory interface that implements a memory scheduling algorithm specific to pre-specified or learned memory access patterns.

The logic devices of the die-stacked memory device 102 may be implemented on the same logic die or on different logic die. In the illustrated example, the reconfigurable logic device 132 is implemented on a different logic die than and the memory controller 130 and data translation controller 140. Moreover, one or more of the logic devices may be implemented across multiple logic layers. To illustrate, the memory controller 130 and the configuration controller 136 may be implemented at one logic die 122 and the reconfigurable logic fabric 134 may be implemented at another logic die 122.

In the depicted implementation of FIG. 1, the die-stacked memory device 102 is implemented in a vertical stacking arrangement whereby power and signaling are transmitted between the logic dies 122 and the memory dies 120 using dense through silicon vias (TSVs) 150 or other vertical interconnects. Although FIG. 1 depicts the TSVs 150 in a set of centralized rows, the TSVs 150 instead may be more dispersed across the floorplans of the dies. Note that FIG. 1 provides an exploded-view representation of the dies 120 and 122 to permit illustration of the TSVs 150 and the components of the dies 120 and 122. In implementation, each of the dies may overlie and be in contact with the preceding die, either directly or via a bonding layer or die attachment mechanism.

The die-stacked memory device 102 may be fabricated using any of a variety of 3D integrated circuit fabrication processes. In one approach, the dies 120 and 122 each are implemented as a separate substrate (e.g., bulk silicon) with active devices and one or more metal routing layers formed at an active surface. This approach can include a wafer-on-wafer process whereby a wafer comprising a matrix of dies is fabricated and thinned, and TSVs are etched through the bulk silicon. Multiple wafers are then stacked to achieve the illustrated layer configuration (e.g., a stack of four wafers comprising memory circuitry dies for the four memory dies 120 and a wafer comprising the logic die for the logic die 122), aligned, and then joined via thermocompression. The resulting stacked wafer set is singulated to separate the individual 3D IC devices, which are then packaged. In a die-on-die process, the wafer implementing each corresponding die is first singulated, and then the dies are separately stacked and joined to fabricate the 3D IC devices. In a die-on-wafer approach, wafers for one or more dies are singulated to generate the dies, and these dies are then aligned and bonded to the corresponding die areas of another wafer, which is then singulated to produce the individual 3D IC devices. One benefit of fabricating the dies 120 and 122 as dies on separate wafers is that a different fabrication process can be used to fabricate the logic dies 122 than that used to fabricate the memory dies 120. Thus, a fabrication process that provides improved performance and lower power consumption may be used to fabricate the logic dies 122 (and thus provide faster and lower-power interface logic and circuitry for the reconfigurable logic device 132), whereas a fabrication process that provides improved cell density and improved leakage control may be used to fabricate the memory dies 120 (and thus provide more dense, lower-leakage bitcells for the stacked memory).

In another approach, the dies 120 and 122 are fabricated using a monolithic 3D fabrication process whereby a single substrate is used and each die is formed on a preceding die using a die transfer process, such as an ion-cut process. The die-stacked memory device 102 also may be fabricated using a combination of techniques. For example, the logic dies 122 may be fabricated using a monolithic 3D technique, the memory dies may be fabricated using a die-on-die or wafer-on-wafer technique, or vice versa, and the resulting logic die stack and memory die stack then may be bonded to form the 3D IC device for the die-stacked memory device 102.

Figure 2:
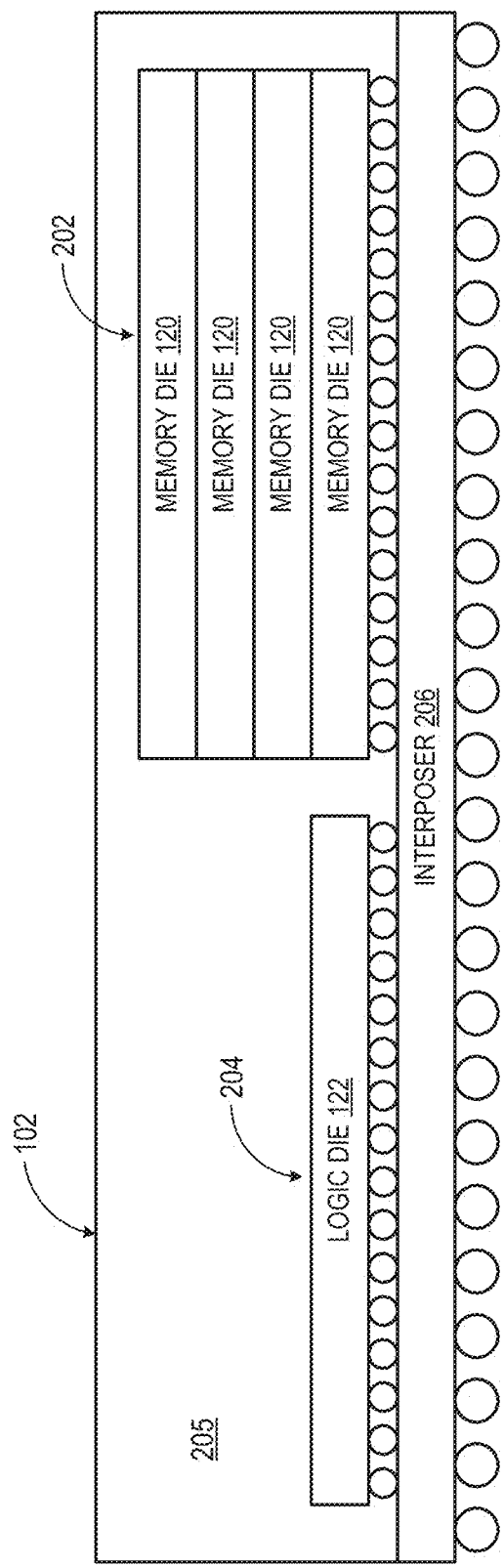
FIG. 2 is a diagram illustrating a cross-sectional view of a side-split configuration of the die-stacked memory device of FIG. 1 in accordance with some embodiments.

FIG. 2 illustrates a cross-section view of an alternative implementation of the die-stacked memory device 102 in accordance with some embodiments. Rather than implement a vertical stack implementation as shown in FIG. 1 whereby the one or more logic dies 122 are vertically aligned with the memory dies 120, the die-stacked memory device 102 instead may implement the side-split arrangement of FIG. 2. In this side-split arrangement, the stacked memory dies 120 are implemented as an IC device 202 and the one or more logic dies 122 are implemented as a separate IC device 204, and the IC devices 202 and 204 (and thus the logic dies 122 and the memory dies 120) are connected via an interposer 208. The interposer 208 can comprise, for example, one or more levels of silicon interposers, a printed circuit board (PCB), or a combination thereof. Although FIG. 2 illustrates the stacked memory dies 120 implemented together as a single IC device 202, the stacked memory dies 120 instead may be implemented as multiple IC devices 202, with each IC device 202 comprising one or more memory dies 120. Likewise, the logic dies 122 may be implemented as a single IC device 204 or as multiple IC devices 204. The one or more IC devices 202, the one or more IC devices 204, and the unifying interposer 208 are packaged as an IC package 205 representing the die-stacked memory device 102.

Figure 3:
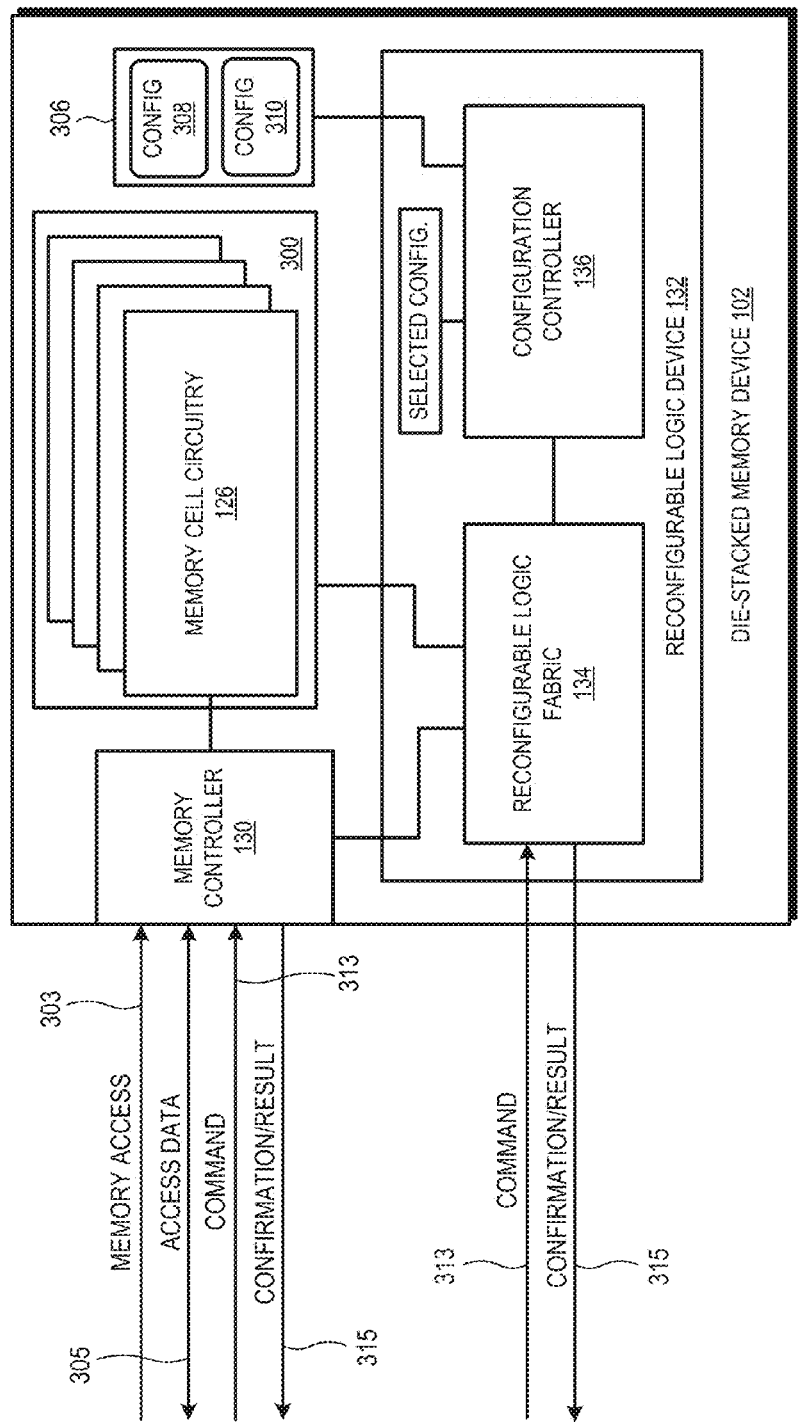
FIG. 3 is a block diagram illustrating a die-stacked memory device implementing a reconfigurable logic device in accordance with some embodiments.

FIG. 3 illustrates, in block diagram form, a die-stacked memory device 302 implementing the reconfigurable logic device 132 in accordance with some embodiments. In the illustrated example, the die-stacked memory device 302 (one embodiment of the die-stacked memory 102) implements a stacked memory 300 represented by a set of one or more stacked dies of memory cell circuitry 126. In operation, the die-stacked memory device 302 functions as a conventional system memory for storing data on behalf of other system components, such as the external devices 104-107 of FIG. 1. In a conventional memory access operation, an external device issues a memory access request 303 by manipulating the physical interface (PHY) of its memory controller to transmit address signaling and, if the requested memory access is a write access, data signaling via the interconnect 108 (FIG. 1) to the die-stacked memory device 302. The PHY of the memory controller 130 or a separate memory controller implemented by the reconfigurable logic device 132 receives the signaling, buffers the memory access request represented by the signaling, and then accesses the memory cell circuitry 126 to fulfill the requested memory access. In the event that the memory access request 303 is a write access, the receiving memory controller stores signaled data 305 to the location of the stacked memory 300 indicated by the signaled address. In the event that the memory access request 303 is a read request, the memory controller accesses the requested operational data from the location of the stacked memory 300 corresponding to the signaled address and manipulates the PHY of the memory controller to transmit signaled data 305 representative of the accessed data to the requesting external device via the interconnect 108.

Moreover, the reconfigurable logic device 134 of the die-stacked memory device 302 also functions to offload certain data manipulation operations from the external devices of the processing system 100. These data manipulation operations typically leverage the tight integration between the logic dies 122 and the stacked memory dies 120 so as to efficiently manipulate the data stored in the stacked memory 300 without involving substantial back-and-forth signaling via the interconnect 108 (FIG. 1), thereby freeing the bandwidth of the interconnect 108 for other uses. Such data manipulation operations can include, but are not limited to, searches, gather/scatter operations, pointer chasing operations, compression, encryption, erasing blocks of memory, error correction code (ECC), endianness translation, digital signal processing, image/video filtering and other processing, video encoding/decoding/transcoding, and the like.

The data manipulation operations performed by the reconfigurable logic device 132, or the manner in which data manipulation operations are performed, is controlled by the programmed logic configuration of the reconfigurable logic fabric 134. As noted above, the particular logic configuration programmed into the reconfigurable logic fabric 134 may be set at assembly time or programmed via an external programming device. In some embodiments, the reconfigurable logic device 132 includes the on-die configuration controller 136 that programs the reconfigurable logic fabric 134 to implement a specified logic configuration. To this end, the die-stacked memory device 302 includes a configuration store 306 to store one or more configuration files, such as configuration files 308 and 310. The configuration store 306 may be implemented in a portion of the memory cell circuitry 126 on the memory dies 120, as a volatile or non-volatile memory on one or more logic dies, or a combination thereof. Each configuration file comprises the configuration data programmed into the reconfigurable logic fabric 134 to implement a corresponding logic configuration. Typically, the configuration data is formatted as a binary stream that the configuration controller 136 streams into the reconfigurable logic fabric 134 via a serial I/O interface (not shown) or a JTAG port (not shown) of the reconfigurable logic fabric 134. In other implementations, the configuration store 306 may be externally implemented relative to the die-stacked memory device 302. For example, the configuration store 306 could be implemented in a removable storage device (e.g., a universal serial bus (USB)-based storage drive or "thumb stick") that is connected to the die-stacked memory device 302 via a peripheral bus and an I/O controller. In such instances, the configuration controller 136 is configured to access the external configuration store 306 via, for example, the memory controller 130 to obtain a specified configuration file and program the reconfigurable logic fabric 134 accordingly.

The programming of the reconfigurable logic fabric 134 to implement a programmed logic configuration occurs in response to a programming event. The programming event may include, for example, a power-on reset, a reprogram command sent as command signaling 313 from an external device to the memory controller 130 via the memory interconnect 108 or to a separate interface via a separate side-band interconnect 142, the lapse of a timer at the die-stacked memory device 302, the performance of a specified number of operations or the achievement of another metric by the reconfigurable logic device 132, the storage of a particular value at a control register, and the like. To illustrate, the reconfigurable logic fabric 134 could be implemented as an SRAM-based FPGA architecture, and thus its programmed state is lost when the die-stacked memory device 302 is reset or otherwise disconnected from power. Accordingly, upon reset, the configuration controller 136 accesses a specified configuration file from the configuration store 306, programs the reconfigurable logic fabric 134 using the configuration file, and then brings the reconfigurable logic fabric 134 online after this initialization process. As another example, the reconfigurable logic fabric 134 could be implemented using a persistent memory fabric, such as a flash-based FPGA architecture, and thus the programmed logic configuration is maintained until, for example, a new programmed logic configuration is selected by an external device.

In some embodiments, the configuration store 306 can store multiple configuration files, and the reconfigurable logic device 132 can be switched among the logic configurations represented by these configuration files by the configuration controller 136. To this end, the reconfigurable logic device 132 can include a software-accessible configuration element 314, such as a programmable register or programmable location in the memory cell circuitry 126, that stores a configuration select value that identifies the configuration file to be selected by the configuration controller 136 for implementation. The configuration select value can include, for example, an index value, a file name, or other pointer that identifies a particular configuration file (e.g., by identifying a start location of the particular configuration file).

In some instances, the data manipulation operations performed by the reconfigurable logic fabric 134 in accordance with its programmed logic configuration may utilize data stored in the stacked memory 300. To illustrate, the programmed logic configuration may provide for a search operation whereby the reconfigurable logic fabric 134 searches a specified memory range for a specified value and returns the memory location storing the value if so found. As another example, the programmed logic configuration may provide for decryption of encrypted data stored in the stacked memory 300 after a successfully completed challenge-response process. In some instances, the data manipulation operations performed by the reconfigurable logic fabric 134 in accordance with its programmed logic configuration result in data being stored to the stacked memory 300. To illustrate, the programmed logic configuration may provide an encryption operation whereby write data provided by an external device for storage at the die-stacked memory device 302 is encrypted by the reconfigurable logic fabric 134 before being stored in the stacked memory 300. Moreover, in some instances, the data manipulation operations include both accessing data from the stacked memory 300 and storing data to the stacked memory 300. For example, the programmed logic configuration may provide for an endianness translation whereby the reconfigurable logic fabric 134 translates the data stored at a specified data range from big endian byte ordered notation to little endian byte ordered notation. In each of these instances, the reconfigurable logic fabric 134 benefits from its tight integration with the stacked memory 300 in that the reconfigurable logic fabric 134 can experience less latency and bandwidth restriction in performing these operations than would be experienced by an external device attempting the same operations.

The reconfigurable logic device 132, in some embodiments, self-initiates data manipulation operations; that is, the reconfigurable logic device 132 performs certain data operations without explicit instruction to do so from another device. For example, the reconfigurable logic device 132 may be programmed to encrypt data stored to the stacked memory 300 and then decrypt it when it is accessed in a manner that is transparent to the software executing at the external devices. As another example, the reconfigurable logic device 132 may track memory accesses by external devices and prefetch data in anticipation of its request by an external device based on a pattern detected in the tracked memory accesses. In other embodiments, the reconfigurable logic device 132 performs data manipulation operations in response to an explicit command transmitted as command signaling 313 received from an external device. The command signaling 313 can be transmitted via a side-band bus, or it may be communicated as, for example, a write access to a special memory address, where the write value represents the operation to be performed. To illustrate, an external device may issue a search command as command signaling 313 with a value to be searched to the reconfigurable logic device 132, in response to which the reconfigurable logic device 132 searches a specified memory range for the search value and returns the memory address storing the matching value via confirmation/result signaling 315. The reconfigurable logic device 132 further can signal, via a confirmation/result signaling 315, confirmation that a requested operation has been performed by the reconfigurable logic device 132.

Figure 4:
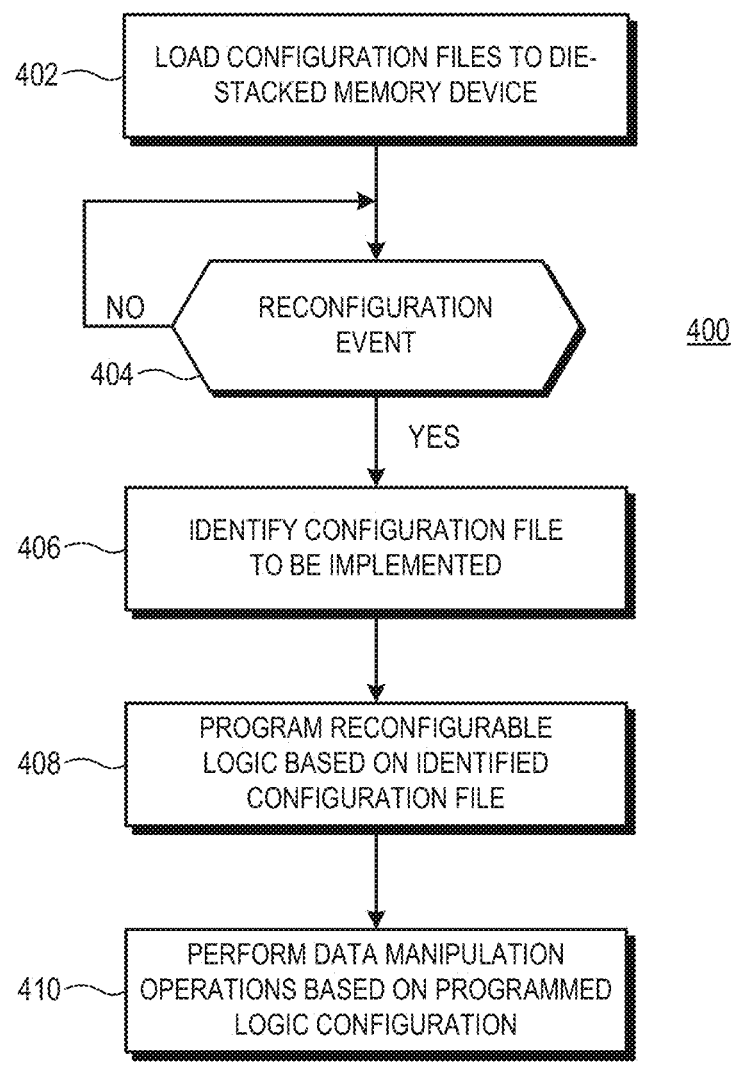
FIG. 4 is a flow diagram illustrating an example method of programming a reconfigurable logic device of a die-stacked memory device in accordance with some embodiments.

FIG. 4 illustrates a method 400 for reconfiguring and operating the die-stacked memory device 302 in accordance with some embodiments. For ease of illustration, the method 400 is described in the example context of the implementation of the processing system depicted in FIG. 3. The method 400 initiates at block 402 whereupon one or more configuration files are loaded to the configuration store 306 of the die-stacked memory device 302. The configuration files may be loaded at assembly time, loaded by a distributor before being supplied to an end user, or loaded in the field. As noted, the configuration store 306 may be integrated with one or both of the stacked memory 300 or memory on one or more logic dies 122, or the configuration store 306 may be implemented in fixed or removable storage external to the die-stacked memory device 302.

At block 404, the configuration controller 136 monitors for a reconfiguration event. A reconfiguration event can include, for example, a power-on reset, a lapse of a timer, a condition detected by the programmed logic configuration of the reconfigurable logic fabric 134 (for example, completion of a data manipulation operation), a reconfiguration command received as command signaling 313 from an external device, or a change in the value stored at the configuration element 314, such as when an operating system stores a new value to the configuration element 314 to change the programmed logic configuration.

In response to detecting a reconfiguration event, the configuration controller 136 identifies the next configuration file to be used to program the reconfigurable logic fabric 134 at block 406. As noted above, this configuration file may be identified by the value stored in the configuration element 314. Alternatively, the reconfigurable logic device 132 may support the storage of only a single configuration file at a time, in which case the configuration file may be stored at a default location in the configuration store 306, which is accessed by the configuration controller 136 in response to a power-on reset (one example of the reconfiguration event). With the configuration file identified, at block 408 the configuration controller 136 programs the reconfigurable logic fabric 134 by streaming the binary file representing the configuration file into the reconfigurable logic fabric 134 using its serial I/O port or JTAG port.

After completing the programming of the reconfigurable logic fabric 134, the configuration controller 136 signals that the initialization process has completed, and thus at block 410 the reconfigurable logic fabric 134 is enabled to perform data manipulation operations based on the programmed logic configuration. As noted above, these data manipulation operations may be self-initiated or initiated by an external device, and they may use data stored in the stacked memory 300 or generate data to be stored in the stacked memory 300. Moreover, the process of blocks 404-410 may be repeated in response to a new reconfiguration event so as to reprogram the reconfigurable logic device 132 to another logic configuration.

Figure 5:
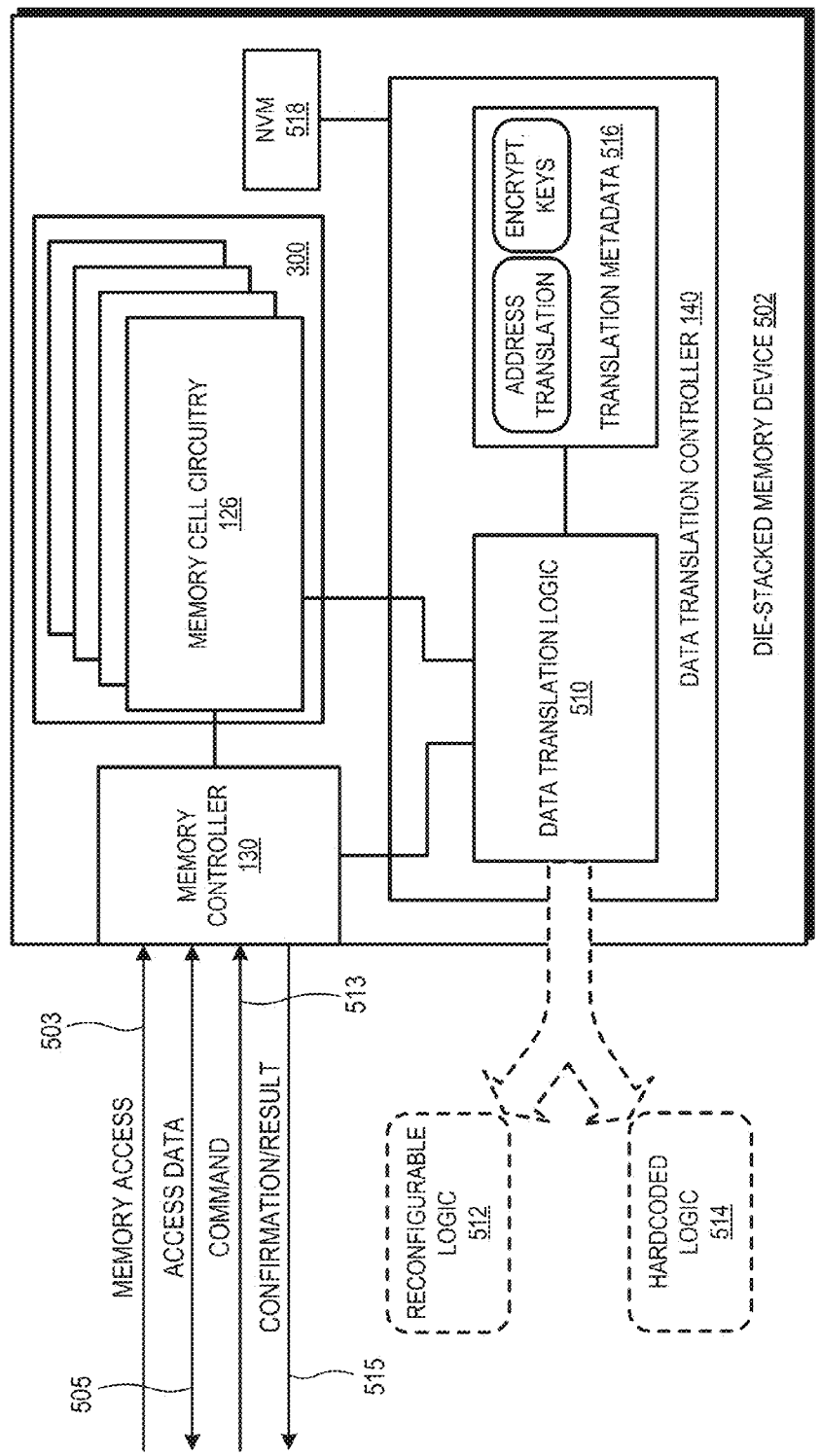
FIG. 5 is a block diagram illustrating a die-stacked memory device implementing a data translation controller in greater detail in accordance with some embodiments.

FIG. 5 illustrates, in block diagram form, a die-stacked memory device 502 implementing the data translation controller 140 in accordance with some embodiments. In the illustrated example, the die-stacked memory device 502 (one embodiment of the die-stacked memory 102) implements the stacked memory 300 represented by a set of one or more stacked dies 122 (FIG. 1) of memory cell circuitry 126 and operates as a conventional system memory for storing data on behalf of other system components, such as the external devices 104-107 of FIG. 1. As similarly described above with respect to FIG. 3, the die-stacked memory device 502, in its role as system memory, receives memory access requests 503 which are fulfilled by the memory controller 130 with respect to the stacked memory 300. Fulfilling these memory access requests can include receiving data signaling 505 representing data from an external device, or transmitting data signaling 505 representing data output from the die-stacked memory device 502.

However, before storing received data to the stacked memory 300, the data translation controller 140 may perform one or more data translation operations to translate the received data, and wherein it is the translated data that is then stored to the stacked memory 300. Similarly, before providing data accessed from the stacked memory 300 to an external device, the data translation controller 140 may perform one or more data translation operations to translate the accessed data, and wherein it is the translated data that is then provided to the external device. Moreover, the data translation controller 140 may perform in-situ, or in-place, translations of data stored in the stacked memory 300. These data translation operations typically leverage the tight integration between the logic dies 122 and the stacked memory dies 120 so as to efficiently manipulate the data stored in the stacked memory 300 without involving substantial back-and-forth signaling via the interconnect 108 (FIG. 1), thereby freeing the bandwidth of the interconnect 108 for other uses.

To this end, the data translation controller 140 implements data translation logic 510 that is configured to perform one or more data translation operations on input data to generate translated output data. In some embodiments, the data translation logic 510 may be implemented at least in part as reconfigurable logic 512, such as the reconfigurable logic fabric 134 described above. In other embodiments, the data translation logic 510 is implemented as hard-coded logic 514, such as an application-specific integrated circuit (ASIC). Moreover, in some embodiments, the data translation logic 510 is implemented as a combination of reconfigurable logic 512 and hard-coded logic 514. For example, the data translation logic 510 may support both endian format translation and encryption/decryption operations. As the endian format translation process is relatively simple and is unlikely to change, the data translation logic 510 may implement the endian format translation operation in hard-coded logic. However, as the encryption/decryption operations are more complex and new encryption/decryption algorithms are constantly being introduced, the data translation logic 510 may implement the encryption/decryption operations in reconfigurable logic 512 so as to facilitate their updating or replacement with different encryption/decryption algorithms using the programming techniques described above.

In some embodiments, the data translation operations performed by the data translation logic 510 may require or benefit from access to certain translation metadata, such as encryption keys, user identifiers, look-up tables, address translation tables, and the like. To this end, the data translation controller 140 further may implement, or have access to, a translation metadata memory 516 that is used to persistently or non-persistently store such translation metadata. The translation metadata memory 516 may be implemented in a portion of the memory cell circuitry 126 on the memory dies 120, as a volatile or non-volatile memory on one or more logic dies (e.g., in a non-volatile memory 518), or a combination thereof.

It may be useful to make the operation of the data translation controller 140 transparent to the external user devices such that the die-stacked memory device 502 appears to be a conventional system memory. In such instances, the data translation controller 140 may self-initiate data translation operations without explicit instruction to do so from another device. To illustrate, the data translation controller 140 may compress or encrypt data from an external device before storing it to the stacked memory 300, and then decompress or decrypt the data before subsequently outputting it to an external device. As another example, the data translation controller 140 may receive data in a little endian byte ordering from a first external device and translate it to big endian byte ordering when it is accessed by a second external device. With this approach, the die-stacked memory device 502 appears as a little-endian-ordered system memory to the first external device and yet appears as a big-endian-ordered system memory to the second external device.

In other embodiments, the data translation functionality of the die-stacked memory device 502 is an advertised feature that is specifically exploited by the external devices of the system. The data translation controller 140 may perform certain data manipulation operations in response to an explicit command transmitted as command signaling 513 received from an external device. To illustrate, an external device may issue a sort command as command signaling 513 and the data group to be sorted as data signaling 505, in response to which the data translation logic 510 sorts the elements of a data block and returns a data block containing the sorted data elements via confirmation/result signaling 515.

FIGS. 6-9 illustrate examples of the data translation operation types that may be performed by the data translation controller 140. A memory transaction process of the data translation controller 140 with respect to a set of data can include none, one, or a combination of these data translation operations types.

Figure 6:
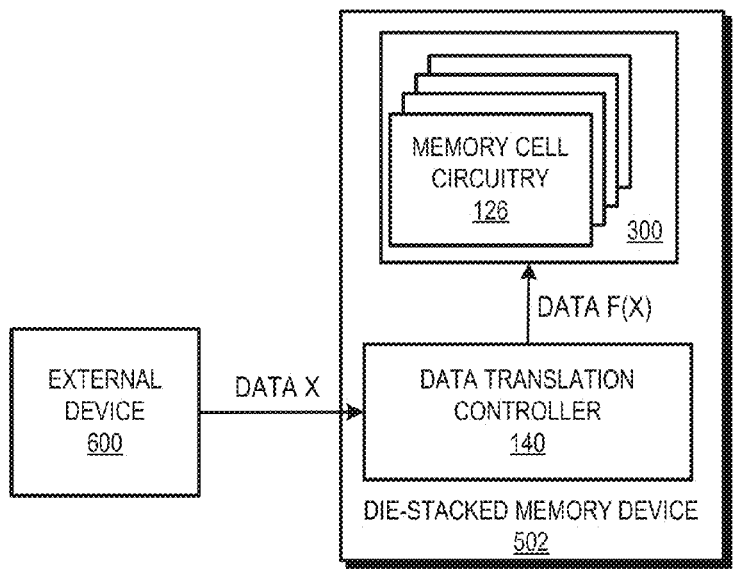
FIG. 6 is a diagram illustrating an example receive-translate-store operation performed by a data translation controller of a die-stacked memory device in accordance with some embodiments.

FIG. 6 illustrates a receive-translate-store operation whereby an external device 600 provides data X to the die-stacked memory device 502, whereupon the data translation controller 140 performs a data translation operation F( ) on the data X, resulting in translated data F(X). As depicted in FIG. 6, the translated data F(X) then is stored in the memory cell circuitry 126 of the stacked memory 300. Alternatively, the translated data F(X) may be provided to an external device without being stored in the stacked memory 300 after the translation process has completed. In either situation, the data translation operation F( ) may be performed by the data translation controller 140 in response to an explicit translation command from the external device 600. The data translation operation F( ) may be performed as an automatic operation done independent of command signaling from the external device 600, although the external device 600 or other external device may configure the data translation controller 140 to automatically apply the data translation operation F( ) through a programmable configuration setting of the die-stacked memory device 502.

Figure 7:
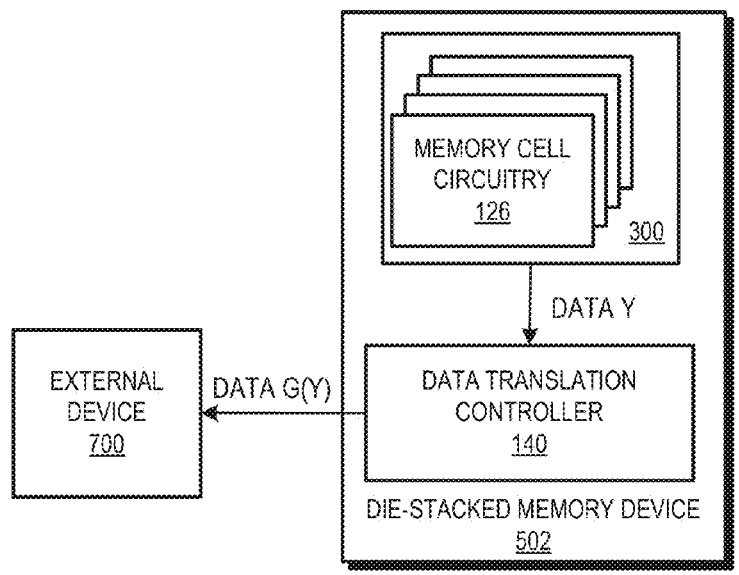
FIG. 7 is a diagram illustrating an example access-translate-output operation performed by a data translation controller of a die-stacked memory device in accordance with some embodiments.

FIG. 7 illustrates an access-translate-output operation whereby the data translation controller 140 accesses data Y from the stacked memory 300 via the memory controller 130 or a separate dedicated memory controller, performs a data translation operation G( ) on the accessed data Y, and provides the resulting translated data G(Y) to an external device 700. The data translation operation G( ) may be performed in response to command signaling from the external device 700 (e.g., such as a read command specifying the return of the accessed data in a little-endian byte ordered format) or may be automatically performed independent of command signaling from an external device and thus may be transparent to the external device 700.

Figure 8:
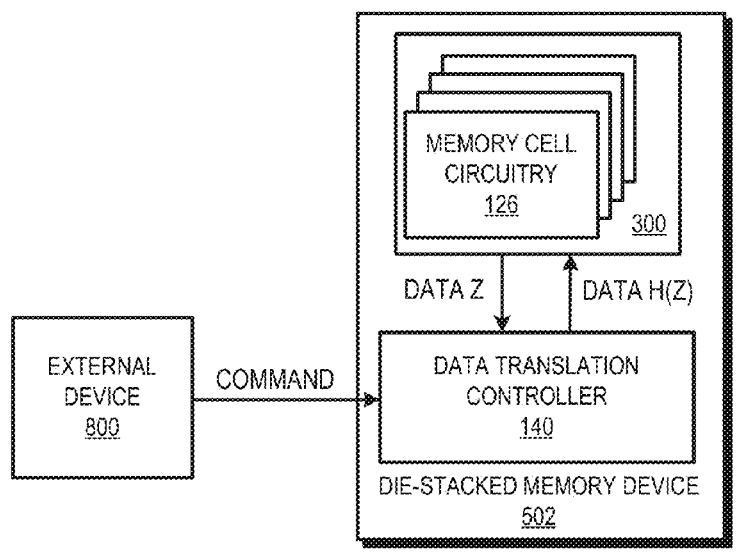
FIG. 8 is a diagram illustrating an example in-situ translation operation performed by a data translation controller of a die-stacked memory device in accordance with some embodiments.

FIG. 8 illustrates as access-translate-store operation whereby the data translation controller 140 accesses data Z from the stacked memory 300, performs a data translation operation H( ) on the accessed data Z, and then stores the resulting translated data H(Z) in the stacked memory 300. The translated data H(Z) may replace the original data Z in the stacked memory 300, or may be stored in addition to the original data Z in the stacked memory 300. As with the other operations described above, the data translation operation H( ) may be performed in response to a command 802 issued by an external device 800, or it may be performed automatically without express control by an external device.

Figure 9:
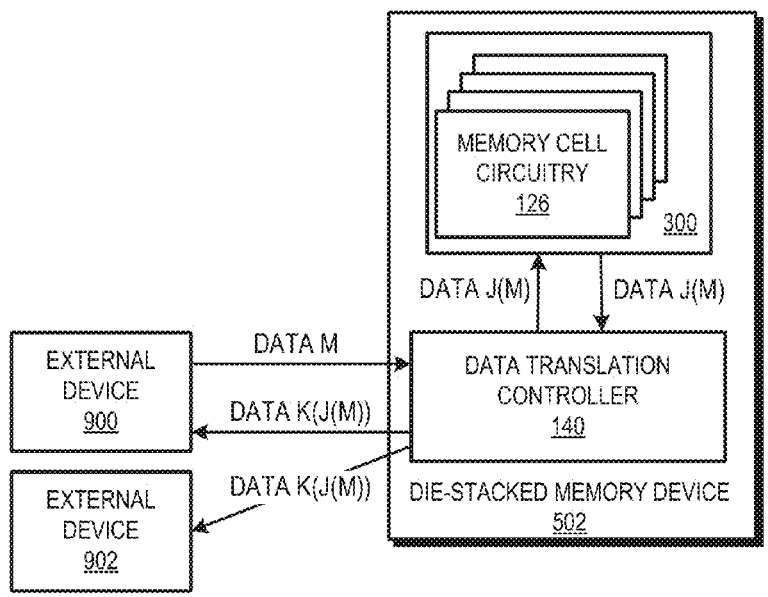
FIG. 9 is a diagram illustrating an example translate-store-translate operation performed by a data translation controller of a die-stacked memory device in accordance with some embodiments.

FIG. 9 illustrates a receive-translate-store-access-translate-output data translation operation whereby an external device 900 transmits data M to the die-stacked memory device 502, whereupon the data translation controller 140 translates the data M using a data translation operation J( ), resulting in translated data J(M). The translated data J(M) is then stored in the stacked memory 300. Subsequently, the data translation controller 140 accesses at least a portion of the translated data J(M) from either the stacked memory 300 or a local cache of the translated data J(M) stored at a memory structure on a logic die 122, translates it according to a data translation operation K( ) to generate translated data K(J(M)), which is then output to the external device 900 that sourced the original data M, to a different external device 902, or to both external devices. In some embodiments, the data translation operation J( ) and data translation operation K( ) are inverse translations or complementary translations. For example, the data translation operation J( ) can comprise an encryption operation or compression operation and the data translation operation K( ) can comprise the complementary decryption operation or decompression operation. In some embodiments, the data translation operations J( ) and K( ) may be non-complementary translations. For example, the data translation operation J( ) may comprise an endianness format translation and the data translation operation K( ) may comprise a character encoding format translation, such as an American Standard Code for Information Interchange (ASCII)-to-Unicode character encoding translation.

The processing of data at the die-stacked memory device 102 can include any of the receive-translate-store operations, access-translate-output operations, access-translate-store operations, or receive-translate-store-access-translate-output operations described above, as well as various combinations thereof or modifications thereto.

As one example, the die-stacked memory device 502 can provide compression/decompression functionality. To illustrate, the data translation controller 140 may implement a receive-translate-store operation to compress data received from an external device and then store the data in the stacked memory 300, or then provide the compressed data back to the external device. When the data is requested from the die-stacked memory device 502, the data translation controller 140 may implement an access-translate-output operation to decompress the requested data and then output the decompressed data to the requesting device.

To illustrate, a peripheral component, such as a disk controller or network interface, may implement a direct memory access (DMA) transfer to write data from a disk or network interface directly to the die-stacked memory device 102, which in turn automatically compresses the received data for storage in the stacked memory 300 and decompresses the stored data when it is requested by a CPU. In contrast, a conventional system would require that the data first be routed to the CPU and a software routine running on the CPU would then have to perform the compression on the data before writing it back to memory.

Conversely, to save power and bandwidth on the interconnect 108 connecting the die-stacked memory device 502 to the external devices, the large data blocks may be communicated between the external devices and the die-stacked memory device 502 in a compressed format. To enable updates or modifications to only a portion of a stored data block, the die-stacked memory device 502 may store data blocks in uncompressed form in the stacked memory 300, and thus the data translation controller 140 may perform a receive-translate-store operation to decompress the compressed data blocks before being stored in the stacked memory 300, as well as performing an access-translate-output operation to compress large blocks of data before transmitting the resulting compressed data blocks to the external devices over the interconnect 108.

When compression is used to increase the effective capacity of the stacked memory 300, the memory controller 130 typically packs the compressed data blocks tightly together in the stacked memory 300 to save space. As such, the storage locations of the compressed data may no longer map to their original address-mapped locations. Accordingly, the memory controller 130 may employ an additional memory translation step using one or more additional address translation tables to convert between a logical address and the physical location of a compressed data block. In some embodiments, these additional address translation tables are stored in the translation metadata memory 516 (FIG. 5), which may be implemented as a portion of the stacked memory 300 or as a memory structure on one or more logic dies 122 (FIG. 1), and thus the memory controller 130 may implement these translations without the involvement of an external processor.

As another example, the die-stacked memory device 502 can provide encryption/decryption services for data in a processing system. As with the compression examples described above, the data translation controller 140 may encrypt data received from an external device and store the encrypted data in the stacked memory 300. Subsequently, the data translation controller 140 then may decrypt the data before transmitting the data to an external device. Conversely, the die-stacked memory device 502 can store data in unencrypted form to facilitate modification of a portion of the data, but utilize encryption to secure incoming and outgoing data from being usefully snooped. In this case, external devices may provide encrypted data to the die-stacked memory device 502, whereupon the data translation controller 140 decrypts the encrypted data and stores the decrypted data at the stacked memory 300. When an external device requests data, the data translation controller 140 accesses unencrypted data from the stacked memory 300, encrypts the accessed data, and then transmits the resulting encrypted data to the requesting external device via the interconnect 108.

Any of a variety of encryption algorithms, authentication schemes, and key management schemes may be employed by the data translation controller 140. For example, the data translation controller 140 may implement the reconfigurable logic device 132 (FIG. 1), whereby different encryption algorithms are stored as configuration files in the configuration store 306 (FIG. 3), and whereby the configuration controller 136 (FIG. 1) can program the reconfigurable logic fabric 134 (FIG. 1) of the reconfigurable logic device 132 to implement a particular encryption algorithm from a selected one of a plurality of encryption configuration files according to a control setting set by an OS or set in response to a valid user authentication.

As noted above, the die-stacked memory device 502 may be implemented in its own IC package separate from other components of a processing system. This approach has security-related benefits in that it is difficult to gain unauthorized access to the data stored in the stacked memory 300, particularly when the incoming and outgoing data communicated between the die-stacked memory device 502 and the external devices is physically secured from snooping or logically secured through encryption. However, the stacked memory 300 may employ a DRAM or similar memory architecture, and hack attacks have been developed to exploit the fact that electrical charge stored in DRAM does not immediately disappear when power is cut-off. These attacks exploit this vulnerability by using cold reboots to access sensitive data that was intended for only temporary storage in the DRAM, such as encryption keys used in disk encryption systems. Conventional defenses against such attacks rely on physically erasing the memory state on a power cycle. However, this approach often is impracticable from a complexity or power-consumption perspective, and is vulnerable to failure in the event that the erase process can be stopped or bypassed before the DRAM is erased.

The die-stacked memory device 502 can leverage the integrated nature of the data translation controller 140 to encrypt data stored in the stacked memory 300 in a manner that inoculates against such cold-boot attacks. In this situation, the data translation controller 140 encrypts data stored in the stacked memory 300 in accordance with a corresponding encryption key, and whereby the data translation controller 140 automatically reinitializes a new encryption key each time power to the die-stacked memory device 502 is cut off. This way, data stored during a previous power cycle would be unusable as it was encrypted according to an encryption key that is no longer available. In an alternative implementation, the die-stacked memory device 102 can use an encryption key derived from user-supplied information, such as a user's password, and thus making the encrypted data in the stacked memory 300 usable only if the user's password is available to the entity attempting access.

The die-stacked memory device 502 also may provide data translation operations in the form of data format translations. As noted above, the data translation controller 140 can provide endianness translations and ASCII/Unicode translations. To illustrate, many network protocols use big-endian byte ordering, whereas x86-based processors typically use little-endian ordering. In a conventional system, software is employed at the processor to translate data extracted from incoming packets to little-endian byte ordering and to translate data to be encapsulated in outgoing packets to big-endian byte ordering. Rather than consuming the resources of the processor, this endianness translation instead can be offloaded to the die-stacked memory device 502 whereby the extracted data from a network interface is translated to little-endian byte ordering by the data translation controller 140 and the resulting little-endian byte ordered data is stored to the die-stacked memory device 502. The processor subsequently can access the data from the die-stacked memory device 502 without having to translate the data to the little-endian byte ordering before being able to process the data.

Other examples of data format translations that the data translation controller 140 may perform include numeral system translations, such as translating between integer representations and floating-point representations or between different types of floating-point representations (e.g., between binary representations and decimal representations), translating between numeral size representations (e.g., from a 32-bit integer format to a 64-bit integer format or vice versa), translating between different numeral size and numeral system types (e.g., from a 32-bit integer representation to a 64-bit binary floating-point representation), and the like. The particular format translation may depend on the external device requesting the data.

To illustrate, the die-stacked memory device 502 may by default store all data as 64-bit floating-point little-endian byte ordered values for uniformity, and thus may translate all incoming data to this format either by numeral size translation, integer-to-floating-point translation, or endianness translation, and then may retranslate the data as it is output to an external device to the format expected by the external device using one or more of a size translation, floating-point-to-integer translation, or endianness translation (e.g., by translating a data value in the default 64-bit floating-point little-endian format to a 32-bit integer big-endian format expected by a network interface accessing the data value). Moreover, format translations may be performed in-situ by the data translation controller 140 in anticipation of access of the data by a particular data consumer. The particular format configuration for a corresponding data consumer (e.g., external device, software, thread, or other system component) may be programmed by an OS or other system component using a look-up table implemented in the translation metadata memory 516 (FIG. 5).

Another translation service that may be provided by the die-stacked memory device 102 includes data order translations. For example, an external device may provide a data block with unordered data elements, which are then sorted by the data translation controller 140 by performing a sort operation before being stored in the stacked memory 300 as a data block of ordered data elements. In some embodiments, the external device provides this unsorted data block by transmitting the unsorted data block to the die-stacked memory device 502 along with a sort command, an indicator of the sort direction (e.g., lowest-to-highest or highest-to-lowest), an indicator of the size of the data elements (so as to allow the data translation controller 140 to parse the individual data elements out of the data block), and a target address where the sorted data block is to be stored. Alternatively, each data element may be designated as such using an identifier (such as a header having a value reserved for identifying the start of a data element). In some embodiments, the unsorted data block may already be stored in the stacked memory 300, and the external device provides the unsorted data block by transmitting an indicator of the location of the unsorted data block in the stacked memory 300 (e.g., by identify the starting address and size of the data block, as well as a length of each data element). In another implementation, the data elements of a data block may be unordered in the stacked memory 300 and the data translation controller 140 may buffer the data elements at a memory of the logic die 122 (FIG. 1) and order the data elements of the data block before being output to a requesting external device.

The memory dies 120 of the die-stacked memory device 502 may implement a phase change memory (PCM) or flash memory architecture that has a limited write endurance whereby data can no longer be reliably stored in a corresponding bit cell after a certain number of writes to that bit cell. To improve the effective life of the die-stacked memory device 502, the data translation controller 140 can implement data translation operations for wear-leveling purposes whereby data is "swizzled" or otherwise bit-shifted so as to dynamically spread writes to bit cells within a given write to minimize the disparity of write activity. To illustrate, if the granularity of write accesses is a word-sized value, write accesses will tend to modify the lower-order bits rather than the higher-order bits. Accordingly, the data translation controller 140 can employ a bit-shifting operation to bit-shift incoming data in order to spread the writes within that word across all of the bit-cells of the corresponding wordline in the stacked memory 300. Inversely, when the data is accessed from the wordline for output, the data translation controller 140 bit-shifts the data back to its original form before outputting the data to a requested external device.

Figure 10:
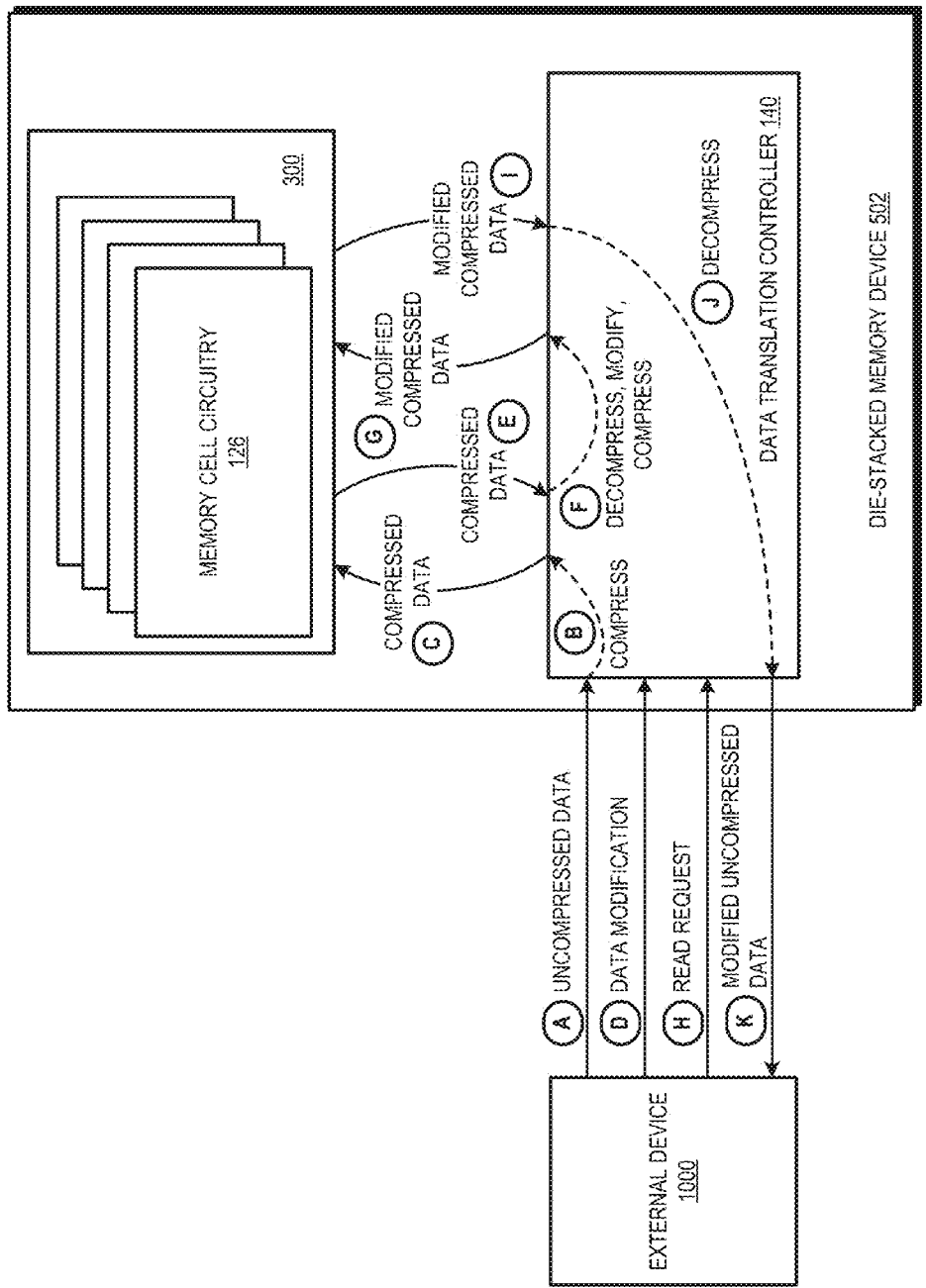
FIG. 10 is a diagram illustrating an example compression/decompression operation with data modification performed by a data translation controller of a die-stacked memory device in accordance with some embodiments.

As noted above, the data translation controller 140 may perform in-situ data translation for a variety of purposes. In some situations, this in-situ translation may be necessary to facilitate modifications to already-translated data stored in the stacked memory 300 of the die-stacked memory device 502. FIG. 10 illustrates an example process for handing modifications to translated data stored in the stacked memory 300 of the die-stacked memory device 502 in the context of compression/decompression as a data translation service. An external device 1000 transmits an uncompressed data block to the die-stacked memory device 502 (operation "A"), whereupon the data translation controller 140 compresses the data block (operation "B") and provides the resulting compressed data block for storage at the stacked memory 300 (operation "C"). At a later point, the external device 1000 issues a write access (operation "D") to overwrite a data element of the data block. In response, the data translation controller 140 accesses a data sub-block containing the data element to be modified (operation "E"). The data translation controller 140 then decompresses the data sub-block and the data element in the resulting uncompressed data sub-block is modified in accordance with the write access (operation "F"). The resulting modified data sub-block is then compressed and stored back to the stacked memory 300 in place of the original compressed data sub-block (operation "G"). Subsequently, the external device issues a read request for the data block (operation "H), in response to which the data translation controller 140 accessed the modified compressed data block from the stacked memory 300 (operation "I"), decompresses the modified compressed data block to generate a modified uncompressed data block (operation "J"), and the transmits the modified uncompressed data block to the external device 1000 (operation "K"). This same process may be employed for encrypted data, or data translated to other formats which cannot be modified in-situ for various reasons.

As the description above illustrates, by implementing the data translation controller 140 at the logic die 122 of the die-stacked memory device 502, the process of storing data as compressed data, modifying the data, and then reading the data out of memory and decompressing the data block requires only two transfers of the data block over the interconnect connecting the external device 1000 and the die-stacked memory device 502. Moreover, in this process, the compression/decompression duties are offloaded from the external device 1000. In contrast, in a conventional system, a modification to compressed data would entail: a processor compressing a data block and transferring the compressed data block to system memory; the processor then reading the compressed data block from system memory, decompressing the data block, modifying the data element of the data block, compressing the modified data block, and then transferring the modified compressed data block back to the system memory; and then reading the modified compressed data block back out of the memory. As such, a conventional system would require at least four data block transfers between the processor and a conventional system memory, while also requiring the processor to handle the compression and decompression of the data block. This unnecessarily consumes interconnect bandwidth and processor bandwidth while also requiring additional power to transmit the data block over the interconnect an additional two times.

In some embodiments, at least some of the functionality described above may be implemented by one or more processors executing one or more software programs tangibly stored at a computer readable medium, and whereby the one or more software programs comprise instructions that, when executed, manipulate the one or more processors to perform one or more functions described above. In some embodiments, the apparatus and techniques described above are implemented in a system comprising one or more integrated circuit (IC) devices (also referred to as integrated circuit packages or microchips), such as the die-stacked memory devices described above with reference to FIGS. 1-10. Electronic design automation (EDA) and computer aided design (CAD) software tools may be used in the design and fabrication of these IC devices. These design tools typically are represented as one or more software programs. The one or more software programs comprise code executable by a computer system to manipulate the computer system to operate on code representative of circuitry of one or more IC devices so as to perform at least a portion of a process to design or adapt a manufacturing system to fabricate the circuitry. This code can include instructions, data, or a combination of instructions and data. The software instructions representing a design tool or fabrication tool typically are stored in a computer readable storage medium accessible to the computing system. Likewise, the code representative of one or more phases of the design or fabrication of an IC device may be stored in and accessed from the same computer readable storage medium or a different computer readable storage medium.

A computer readable storage medium may include any storage medium, or combination of storage media, accessible by a computer system during use to provide instructions and/or data to the computer system. Such storage media can include, but is not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium may be embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

Figure 11:
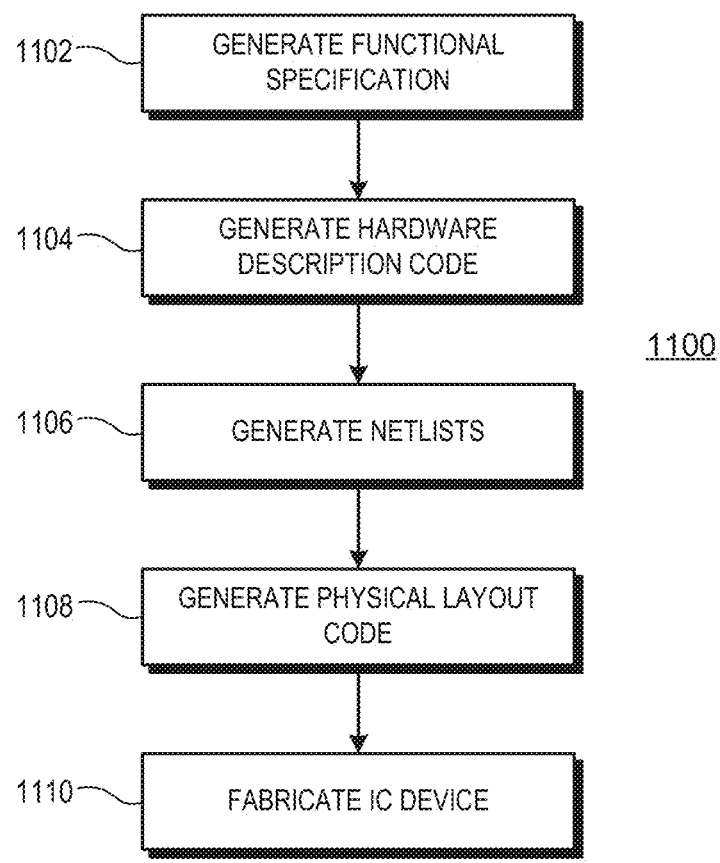
FIG. 11 is a flow diagram illustrating a method for designing and fabricating an integrated circuit (IC) package implementing a die-stacked memory device in accordance with some embodiments.

FIG. 11 is a flow diagram illustrating an example method 1100 for the design and fabrication of an IC device implementing one or more aspects. As noted above, the code generated for each of the following processes is stored or otherwise embodied in computer readable storage media for access and use by the corresponding design tool or fabrication tool.

At block 1102 a functional specification for the IC device is generated. The functional specification (often referred to as a micro architecture specification (MAS)) may be represented by any of a variety of programming languages or modeling languages, including C, C++, SystemC, Simulink™, or MATLAB™.

At block 1104, the functional specification is used to generate hardware description code representative of the hardware of the IC device. In at some embodiments, the hardware description code is represented using at least one Hardware Description Language (HDL), which comprises any of a variety of computer languages, specification languages, or modeling languages for the formal description and design of the circuits of the IC device. The generated HDL code typically represents the operation of the circuits of the IC device, the design and organization of the circuits, and tests to verify correct operation of the IC device through simulation. Examples of HDL include Analog HDL (AHDL), Verilog HDL, SystemVerilog HDL, and VHDL. For IC devices implementing synchronized digital circuits, the hardware descriptor code may include register transfer level (RTL) code to provide an abstract representation of the operations of the synchronous digital circuits. For other types of circuitry, the hardware descriptor code may include behavior-level code to provide an abstract representation of the circuitry's operation. The HDL model represented by the hardware description code typically is subjected to one or more rounds of simulation and debugging to pass design verification.

After verifying the design represented by the hardware description code, at block 1106 a synthesis tool is used to synthesize the hardware description code to generate code representing or defining an initial physical implementation of the circuitry of the IC device. In some embodiments, the synthesis tool generates one or more netlists comprising circuit device instances (e.g., gates, transistors, resistors, capacitors, inductors, diodes, etc.) and the nets, or connections, between the circuit device instances. Alternatively, all or a portion of a netlist can be generated manually without the use of a synthesis tool. As with the hardware description code, the netlists may be subjected to one or more test and verification processes before a final set of one or more netlists is generated.

Alternatively, a schematic editor tool can be used to draft a schematic of circuitry of the IC device and a schematic capture tool then may be used to capture the resulting circuit diagram and to generate one or more netlists (stored on a computer readable media) representing the components and connectivity of the circuit diagram. The captured circuit diagram may then be subjected to one or more rounds of simulation for testing and verification.

At block 1108, one or more EDA tools use the netlists produced at block 1106 to generate code representing the physical layout of the circuitry of the IC device. This process can include, for example, a placement tool using the netlists to determine or fix the location of each element of the circuitry of the IC device. Further, a routing tool builds on the placement process to add and route the wires needed to connect the circuit elements in accordance with the netlist(s). The resulting code represents a three-dimensional model of the IC device. The code may be represented in a database file format, such as, for example, the Graphic Database System II (GDSII) format. Data in this format typically represents geometric shapes, text labels, and other information about the circuit layout in hierarchical form.

At block 1110, the physical layout code (e.g., GDSII code) is provided to a manufacturing facility, which uses the physical layout code to configure or otherwise adapt fabrication tools of the manufacturing facility (e.g., through mask works) to fabricate the IC device. That is, the physical layout code may be programmed into one or more computer systems, which may then control, in whole or part, the operation of the tools of the manufacturing facility or the manufacturing operations performed therein.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed.

Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. An integrated circuit (IC) package comprising:
a die-stacked memory device comprising:
a set of one or more stacked memory dies implementing memory cell circuitry; and
a set of one or more logic dies electrically coupled to the memory cell circuitry, the set of one or more logic dies coupleable to at least one device external to the die-stacked memory device and comprising a data translation controller and a memory controller, wherein the data translation controller is to perform at least one data translation operation comprising at least one of: a data format translation; a wear-leveling translation; and a data order translation.

2. The IC package of claim 1, wherein the data translation controller is to:
translate first data in accordance with a first data translation operation to generate first translated data; and
store the first translated data to the memory cell circuitry of the set of one or more stacked memory dies.

3. The IC package of claim 2, wherein the first data is received from a device external to the die-stacked memory device.

4. The IC package of claim 2, wherein the first data is accessed from the die-stacked memory device prior to data translation.

5. The IC package of claim 2, wherein the data translation controller further is to:
access the first translated data from the memory cell circuitry;
translate the first translated data in accordance with a second data translation operation to generate second translated data; and
provide the second translated data to a device external to the die-stacked memory device.

6. The IC package of claim 5, wherein the second translation operation is an inverse translation of the first translation operation.

7. The IC package of claim 1, wherein the data translation controller is to:
access first data from the set of one or more stacked memory dies; and
translate the accessed first data in accordance with a first translation operation to generate translated data.

8. The IC package of claim 7, wherein the data translation controller further is to:
store the translated data to the memory cell circuitry of the set of one or more stacked memory dies.

9. The IC package of claim 7, wherein the data translation controller further is to:
provide the translated data to a device external to the die-stacked memory device.

10. The IC package of claim 1, wherein the data format translation comprises at least one of: an endian byte ordering translation; a numeral size translation; and a numeral system translation.

11. The IC package of claim 1, wherein the data translation controller is to perform at least one data translation operation at the die-stacked memory device in response to a data translation command received from a device external to the die-stacked memory device via a side-band interconnect.

12. The IC package of claim 1, wherein the data translation controller comprises:
a reconfigurable logic device comprising:
a reconfigurable logic fabric; and
a configuration controller to program the reconfigurable logic fabric to have a programmed logic configuration for performing at least one data translation operation based on a configuration file selected from a plurality of configuration files stored at the IC package.

13. The IC package of claim 1, wherein:
the data translation controller further is to perform an encryption operation to encrypt data stored at the memory circuitry of the set of one or more stacked memory dies using a key value; and
wherein the data translation controller is to randomly initialize the key value responsive to a power cycling of the IC package.

14. A method comprising:
receiving first data at a die-stacked memory device, the die-stacked memory device comprising a set of one or more stacked memory dies comprising memory cell circuitry and comprising a set of one or more logic dies electrically coupled to the set of one or more stacked memory dies, the set of one or more logic dies comprising a data translation controller;
translating the first data at a data translation controller in accordance with a first data translation operation to generate first translated data, wherein the first data translation operation comprises at least one of: a data format translation; a wear-leveling translation; and a data order translation; and
storing the first translated data to the memory cell circuitry of the set of one or more stacked memory dies.

15. The method of claim 14, wherein receiving the first data comprises one of:
receiving the first data from a device external to the die-stacked memory device; and
accessing the first data from the memory cell circuitry of the set of one or more stacked memory dies.

16. The method of claim 14, further comprising:
accessing the first translated data from the memory cell circuitry;
translating the first translated data at the data translation controller in accordance with a second translation operation to generate second translated data; and
providing the second translated data to a device external to the die-stacked memory device.

17. The method of claim 14, wherein:
the first data comprises a block of data elements; and
translating the first data at the data translation controller in accordance with a first translation operation comprises sorting the data elements of the block in accordance with a sort operation to generate the first translated data, the first translated data comprising a block of ordered data elements.

18. The method of claim 14, wherein the first translation operation comprises the data format translation and wherein the data format translation comprises at least one of:
an endian byte ordering translation; a numeral size translation; and a numeral system translation.

19. The method of claim 14, wherein:
the data translation controller comprises a reconfigurable logic fabric; and
the method further comprises:
  programming the reconfigurable logic fabric to have a programmed logic configuration for performing the first data translation operation based on a configuration file selected from a plurality of configuration files stored at the IC package.

20. A method comprising:
accessing data from memory circuitry of a set of one or more stacked memory dies of a die-stacked memory device, the die-stacked memory device comprising a set of one or more logic dies electrically coupled to the set of one or more stacked memory dies, the set of one or more logic dies comprising a data translation controller and a memory controller;
translating the data at the data translation controller in accordance with a translation operation to generate translated data, wherein the translation operation comprises at least one of: a data format translation; a wear-leveling translation; and a data order translation; and
providing the translated data to a device external to the die-stacked memory device.

21. The method of claim 20, wherein the translation operation comprises the data format translation and wherein the data format translation comprises at least one of: an endian byte ordering translation; a numeral size translation; and a numeral system translation.

22. The method of claim 20, wherein:
the data translation controller comprises a reconfigurable logic fabric; and
the method further comprises:
  programming the reconfigurable logic fabric to have a programmed logic configuration for performing the data translation operation based on a configuration file selected from a plurality of configuration files stored at the IC package.

23. A non-transitory computer readable storage medium storing code that is operable to manipulate at least one computer system to perform a portion of a process to fabricate an integrated circuit (IC) package, the IC package comprising:
a die-stacked memory device comprising:
  a set of one or more stacked memory dies implementing memory cell circuitry; and
  a set of one or more logic dies electrically coupled to the memory cell circuitry, the set of one or more logic dies coupleable to at least one device external to the die-stacked memory device and comprising a data translation controller and a memory controller, wherein the data translation controller is to perform at least one data translation operation for data at the die-stacked memory device, wherein the at least one data translation operation comprises at least one of: a data format translation; a wear-leveling translation; and a data order translation.

* * * * *